(12) United States Patent
Kim et al.

(10) Patent No.: US 8,406,079 B2
(45) Date of Patent: Mar. 26, 2013

(54) ADDRESS OUTPUT TIMING CONTROL CIRCUIT OF SEMICONDUCTOR APPARATUS

(75) Inventors: Young Park Kim, Ichon-shi (KR); Duk Su Chun, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 144 days.

(21) Appl. No.: 12/970,228

(22) Filed: Dec. 16, 2010

(65) Prior Publication Data
US 2011/0271133 A1    Nov. 3, 2011

(30) Foreign Application Priority Data
Apr. 30, 2010  (KR) ........................ 10-2010-0040961

(51) Int. Cl.
*G11C 8/18*  (2006.01)
(52) U.S. Cl. ............................. 365/233.1; 365/189.05
(58) Field of Classification Search ............... 365/233.1, 365/189.05
See application file for complete search history.

(56) References Cited

U.S. PATENT DOCUMENTS

| | | | |
|---|---|---|---|
| 6,191,997 B1 | 2/2001 | Son et al. | |
| 6,262,938 B1 | 7/2001 | Lee et al. | |
| 6,940,777 B2 | 9/2005 | Ooishi | |
| 7,123,542 B2 | 10/2006 | Fekih-Romdhane et al. | |
| 7,265,411 B2 * | 9/2007 | Kang | 257/317 |
| 7,558,152 B2 | 7/2009 | Lee et al. | |
| 2003/0202385 A1 * | 10/2003 | Shin | 365/194 |
| 2005/0105379 A1 * | 5/2005 | Mizuhashi | 365/233 |
| 2009/0022001 A1 * | 1/2009 | Morishita et al. | 365/207 |
| 2009/0070793 A1 | 3/2009 | Yoguchi | |
| 2009/0116299 A1 | 5/2009 | Shin et al. | |

FOREIGN PATENT DOCUMENTS

| | | |
|---|---|---|
| JP | 2000-276877 | 6/2000 |
| KR | 1020070081309 A | 8/2007 |

* cited by examiner

*Primary Examiner* — Michael Tran
(74) *Attorney, Agent, or Firm* — William Park & Associates Ltd.

(57) ABSTRACT

Various embodiments of a control circuit for controlling an address output timing of a semiconductor device are disclosed. In one exemplary embodiment, the circuit may include: a timing signal generation unit configured to decode operation specification information of a semiconductor device and generate a timing signal by delaying a read command or a write command based on a decoding result of the operation specification information; a storage control signal generation unit configured to generate a storage control signal in response to the read command or the write command; an output control signal generation unit configured to generate an output control signal in response to the timing signal; and a storage/output unit configured to store an address in response to the storage control signal, and output the stored address as a timing-adjusted address in response to the output control signal.

16 Claims, 4 Drawing Sheets

ADDRESS OUTPUT TIMING CONTROL CIRCUIT OF SEMICONDUCTOR APPARATUS

CROSS-REFERENCE TO RELATED APPLICATION

The present application claims priority under 35 U.S.C. §119(a) to Korean Patent Application No. 10-2010-0040961, filed on Apr. 30, 2010, in the Korean Intellectual Property Office, which is incorporated herein by reference in its entirety as if set forth in full.

BACKGROUND

1. Technical Field

Various embodiments of the present invention relate to a semiconductor apparatus and, more particularly, to an address output timing control circuit of a semiconductor apparatus.

2. Related Art

When a read or write command is inputted to a semiconductor apparatus (e.g., a semiconductor memory), the semiconductor apparatus provides an address to a corresponding circuit configuration after a period of time predefined according to the operation specification related to the read or write command.

For example, the operation specification related to a read command includes a CAS latency (CL) and a burst length (BL). The operation specification related to a write command includes a CAS latency (CL), a burst length (BL), and a CAS write latency (CWL).

As illustrated in FIG. 1, a conventional control circuit 1 for controlling address output timing includes a plurality of flip-flops DFF, a plurality of latches, and a logic circuit 10. The logic circuit 10 may include a NAND gate.

The plurality of flip-flops DFF shift a write command WRITE to conform to a CAS latency, a burst length, and a CAS write latency. The plurality of latches latch a column address TLA<0>, in response to the shifted write command WRITE, to conform to the CAS latency, the burst length, and the CAS write latency and output the latched column address TLA<0> to the logic circuit 10.

By performing a NAND operation on the outputs of the plurality of latches, the logic circuit 10 output a column address ATCD<0> whose timing has been adjusted based on the CAS latency, the burst length, and the CAS write latency.

Although not illustrated in FIG. 1, the control circuit 1 may also require a circuit configuration for a read command READ that outputs the corresponding column address for the read command READ by applying timings corresponding to the CAS latency and the burst length.

Thus, the conventional control circuit 1 for controlling address output timing control circuit 1 employs a method in which the write and read commands and their respective addresses are sequentially shifted to comply with the CAS latency, burst length, and CAS write latency specifications.

The CAS latency may have a value of 5 to 16, the burst length may have a value of 4 or 8 (for DDR3), and the CAS write latency may have a value of 5 to 12. Consequently, twenty-two flip-flops and twenty-two latches are required so that the column address TLA<0> for the write command WRITE can have the timing according to the preset specification. This is equally applicable to a read command READ.

Accordingly, since the conventional control circuit 1 for controlling address output timing requires the plurality of latches and the plurality of flip-flops, the circuit area may increase.

Furthermore, the CAS latency, the burst length, and the CAS write latency will likely further increase with the advancement in the technological development and speed of semiconductor memories, which may worsen the above-described area problem.

SUMMARY

Accordingly, there is a need for an improved control circuit for controlling address output timing of a semiconductor apparatus that may obviate one or more of the above-mentioned problems or disadvantages. It should be understood, however, that some aspects of the invention may not necessarily obviate one or more of those problems or disadvantages.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purpose of the invention, as embodied and broadly described herein, one aspect of the invention may provide a circuit for controlling address output timing of a semiconductor device. The circuit may include: a timing signal generation unit configured to decode operation specification information of a semiconductor device and generate a timing signal by delaying a read command or a write command based on a decoding result of the operation specification information; a storage control signal generation unit configured to generate a storage control signal in response to the read command or the write command; an output control signal generation unit configured to generate an output control signal in response to the timing signal; and a storage/output unit configured to store an address in response to the storage control signal, and output the stored address as a tinning-adjusted address in response to the output control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
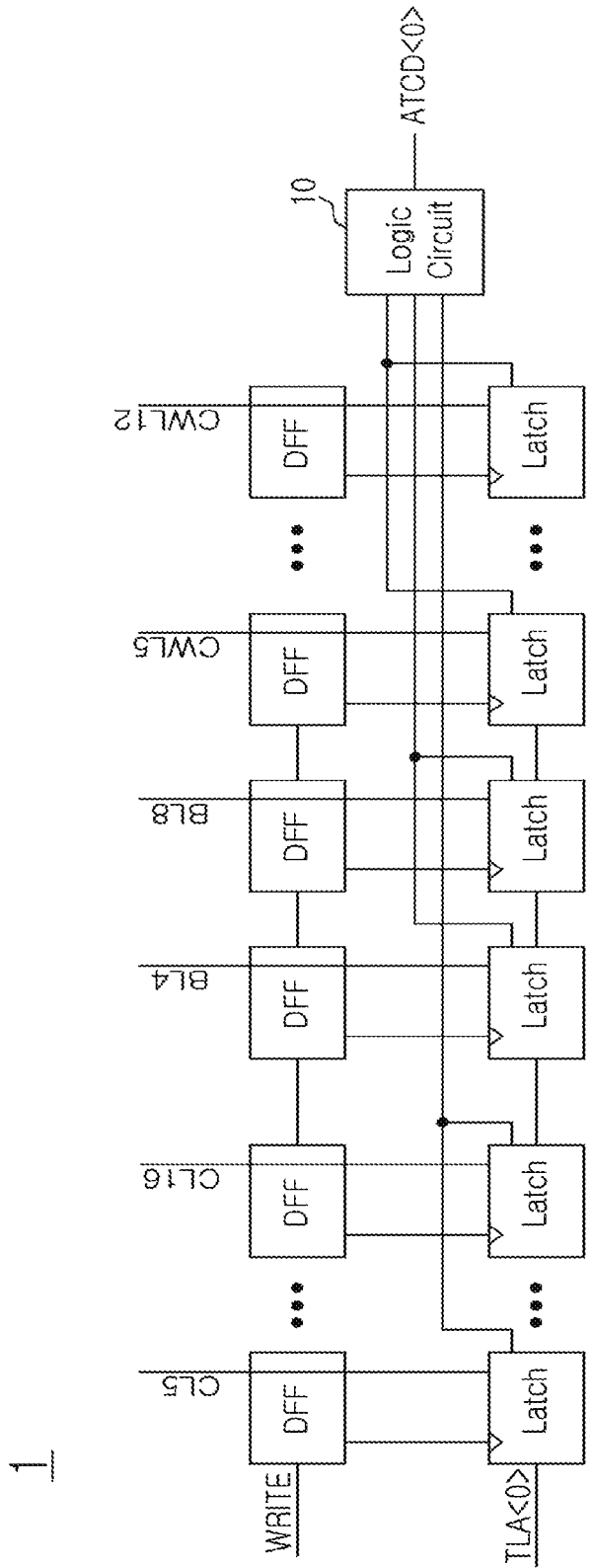
FIG. 1 is a block diagram illustrating a conventional control circuit for controlling address output timing of a semiconductor apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
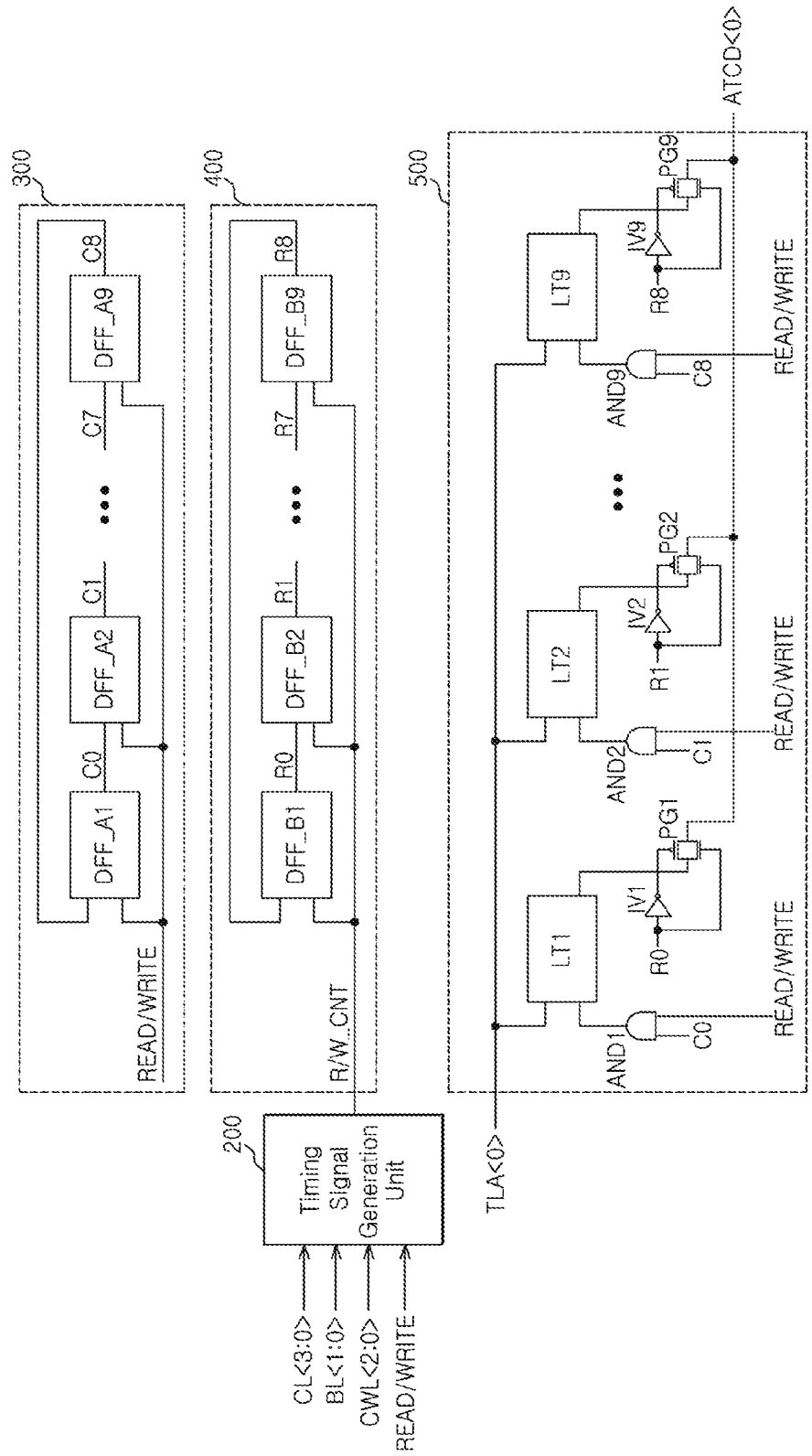
FIG. 2 is a block diagram illustrating a circuit for controlling address output timing of a semiconductor apparatus according to one exemplary embodiment.

As illustrated in FIG. 2, a control circuit 100 for controlling address output timing in a semiconductor apparatus, consistent with various exemplary aspects, may include a timing signal generation unit 200, a storage control signal generation unit 300, an output control signal generation unit 400, and a storage/output unit 500.

The timing signal generation unit 200 may be configured to generate a timing signal R/W_CNT by delaying a read command READ or a write command WRITE, based on a decoding result of semiconductor memory operation specification. The semiconductor memory operation specification may include CAS latencies CL, burst lengths BL, and CAS write latencies CWL.

The CAS latencies CL5 through CL16, the burst lengths BL4 and BL8, and the CAS write latencies CWL5 through CWL12 may be stored in a mode register in a digital information format, such as the CAS latency information CL<3:0>, the burst length information BL<1:0>, and the CAS write latency information CWL<2:0>.

The storage control signal generation unit 300 may be configured to generate storage control signals C<0:8> in response to the read command READ or the write command WRITE.

The storage control signal generation unit 300 may include a plurality of flip-flops DFF_A1 through DFF_A9. The plurality of flip-flops DFF_A1 through DFF_A9 commonly receive the read command READ or the write command WRITE.

The output control signal generation unit 400 may be configured to generate output control signals R<0:8> in response to the timing signal R/W_CNT.

The output control signal generation unit 400 may include a plurality of flip-flops DFF_B1 through DFF_B9. The plurality of flip-flops DFF_B1 through DFF_B9 commonly receive the timing signal R/W_CNT.

The storage/output unit 500 may be configured to store the column address TLA<0> in response to the storage control signals C<0:8> and output the stored column address TLA<0> as the timing-adjusted column address ATCD<0> in response to the output control signals R<0:8>.

The storage/output unit 500 may include a plurality of latches LT1 through LT9, a plurality of AND gates AND1 through AND9, a plurality of inverters IV1 through IV9, and a plurality of pass gates PG1 through PG9.

Each of the plurality of latches LT1 through LT9 may be configured to commonly receive the column address TLA<0> at a first input terminal and receive an output from the respective one of the plurality of AND gates AND1 through AND9 at a second input terminal.

Each of the plurality of inverters IV1 through IV9 may be configured to receive the respective one of the output control signals R<0:8>.

The plurality of pass gates PG1 through PG9 may be configured to receive outputs of the plurality of latches LT1 through LT9, respectively, at input terminals. The plurality of pass gates PG1 through PG9 may also be configured to receive outputs of the plurality of inverters IV1 through IV9, respectively, at first control terminals and the output control signals R<0:8>, respectively, at second control terminals. The pass gates PG1 through PG9 are then configured to output the tinning-adjusted column address ATCD<0> through a commonly coupled output terminal.

Figure 3:
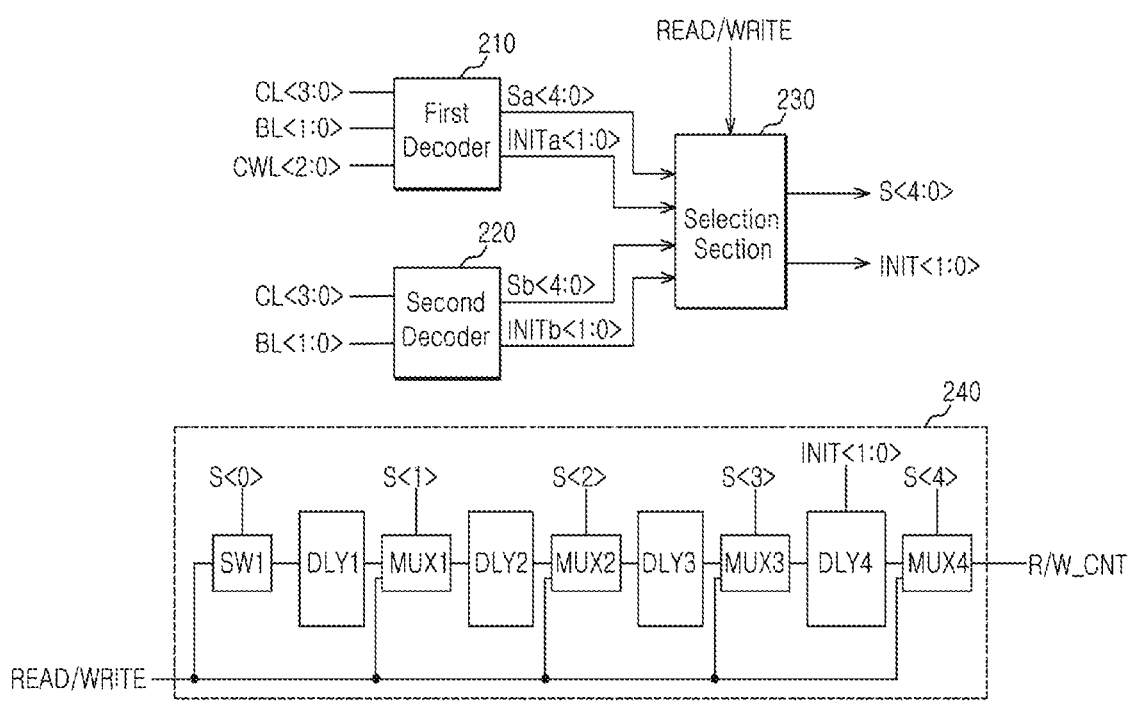
FIG. 3 is a block diagram illustrating an exemplary configuration of a timing signal generation unit of FIG. 2.
Figure 4:
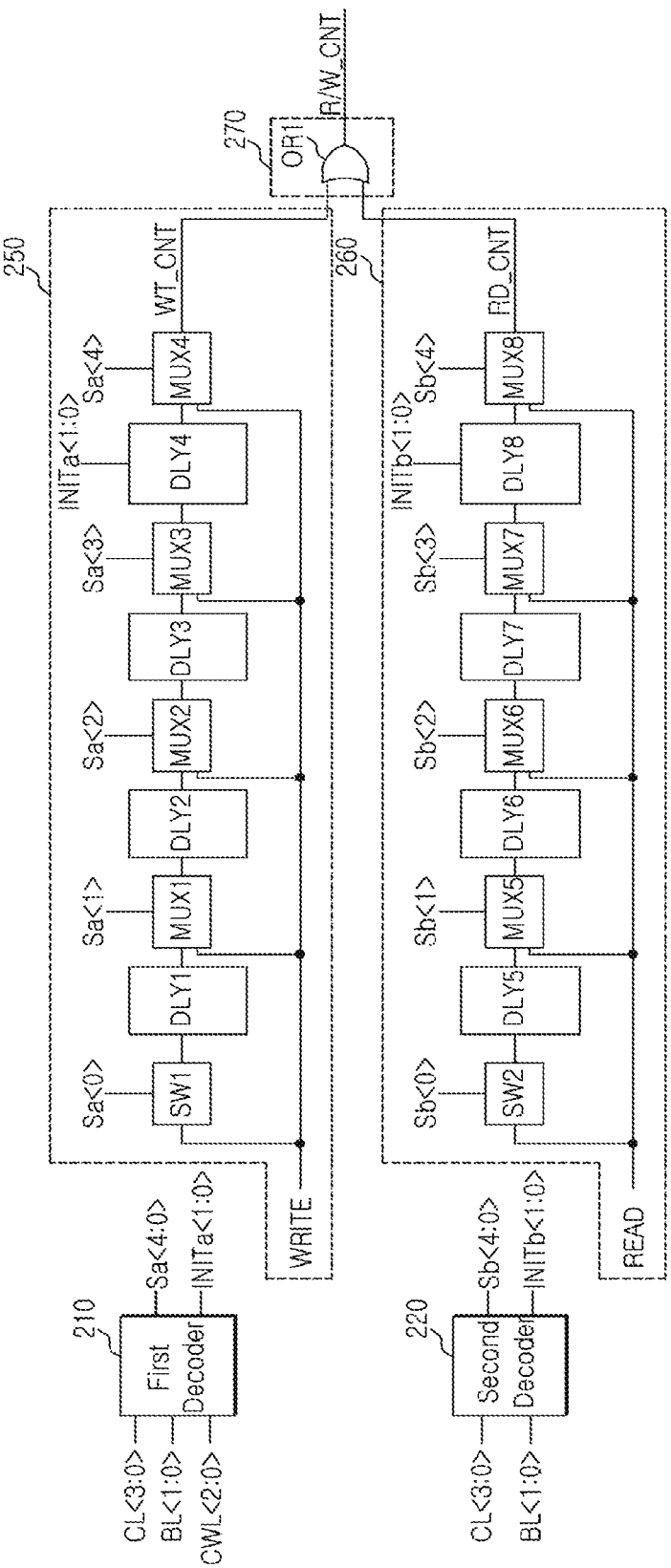
FIG. 4 is a block diagram illustrating another exemplary configuration of the timing signal generation unit of FIG. 2.

According to various exemplary aspects of the invention, the timing signal generation unit 200 of FIG. 2 may be configured as illustrated in FIG. 3 or 4.

As illustrated in FIG. 3, the timing signal generation unit 200a may include a first decoder 210, a second decoder 220, a selection section 230, and a timing adjustment section 240.

The first decoder 210 is configured to generate a write delay control signal by decoding operation specification information related to the write command WRITE. The operation specification related to the write command WRITE includes CAS latency information CL<3:0>, burst length information BL<1:0>, and CAS write latency information CWL<2:0>. The write delay control signal includes first write delay control signals Sa<4:0> and second write delay control signals INITa<1:0>.

The second decoder 220 is configured to generate a read delay control signal by decoding operation specifications related to the read command READ. The operation specifications related to the read command READ includes the CAS latency information CL<3:0> and the burst length information BL<1:0>. The read delay control signal includes first read delay control signals Sb<4:0> and second read delay control signals INITb<1:0>.

The selection section 230 is configured to select the write delay control signal or the read delay control signal in response to the write command WRITE or the read command READ, respectively, and output the selected write or read delay control signal as a delay control signal.

The delay control signal may include first delay control signals S<4:0> and second delay control signals INIT<1:0>.

The timing adjustment section 240 is configured to generate the timing signal R/W_CNT by delaying the write command WRITE or the read command READ by a time period corresponding to the delay control signal.

The timing adjustment section 240 includes a switch SW1, a plurality of delayers DLY1 through DLY4, and a plurality of multiplexers MUX1 through MUX4.

The timing adjustment section 240 is configured to commonly receive the write command WRITE and the read command READ.

The switch SW1 is configured to input the read command READ or the write command WRITE to the first delay DLY1 in response to the first delay control signal S<0>.

Each of the multiplexers MUX1 through MUX4 is configured to select and output either the read or write command READ/WRITE or an output of the respective delayer DLY1 through DLY4 in response to the respective first delay control signal S<4:1>.

Delayers DLY1 through DLY3 are configured to delay the input signals by a predetermined delay period, for example, 4 tCK. Delayers DLY1 through DLY3 may comprise a 2-bit counter.

Delayer DLY4 may differ from delayers DLY1 through DLY3 in that it may vary the delay time period. For example, delayer DLY4 may be configured to receive the second control delay signals INIT<1:0> from the selection section 230 and is configured to delay the input signal by a predetermined variable delay period, for example, 1 tCK to 4 tCK, in response to the second delay control signals INIT<1:0>.

An exemplary operation of the timing signal generation unit 200a shown in FIG. 3 will be described below.

For illustration purposes only, it is assumed that the CAS latency information CL<3:0>, the burst length information BL<1:0>, and the CAS write latency information CWL<2:0> are set such that the column address TLA<0> is outputted after 7 tCK from the input of the write command WRITE.

When the write command WRITE is inputted, the first decoder 210 decodes the CAS latency information CL<3:0>, the burst length information BL<1:0>, and the CAS write latency information CWL<2:0>, and generates the first write delay control signals Sa<4:0> and the second write delay control signals INITa<1:0>.

Since the write command WRITE is inputted, the selection section 230 selects the first write delay control signals Sa<4:0> and the second write delay control signals INITa<1:0> and outputs the selected signals as the first delay control signals S<4:0> and the second delay control signals INIT<1:0>.

The first delay control signals S<4:0> and the second delay control signals INIT<1:0> have values that can enable the timing adjustment section 240 to delay the write command WRITE by 7 tCK.

The switch SW1 is turned off by the first delay control signal S<0>, and multiplexers MUX1, MUX3 and MUX4 select the outputs of delayers DLY1, DLY3 and DLY4, respectively. Multiplexer MUX2 selects the write command WRITE.

In addition, delayer DLY4 is set to have a delay period of 3 tCK by the second delay control signals INIT<1:0>.

Delayers DLY1 through DLY3 are set to have a delay period of 4 tCK. Therefore, the write command WRITE is delayed by 7 tCK through delayers DLY3 and DLY4 and outputted as the timing signal R/W_CNT.

In accordance with another exemplary aspect, as illustrated in FIG. 4, the timing signal generation unit 200b may include a first decoder 210, a second decoder 220, a write timing adjustment section 250, a read timing adjustment section 260, and a combination section 270.

The first decoder 210 and the second decoder 220 may have configurations similar to those of FIG. 3.

The write timing adjustment section 250 is configured to generate a write timing signal WT_CNT by delaying the write command WRITE by a time period corresponding to the write delay control signal.

The write timing adjustment section 250 includes a first switch SW1, a plurality of delayers DLY1 through DLY4, and a plurality of multiplexers MUX1 through MUX4.

The first switch SW1 is configured to input the write command WRITE to the first delayer DLY1 in response to the first write delay control signal Sa<0>.

Each of the multiplexers MUX1 through MUX4 is configured to select and output either the write command WRITE or the output from the respective one of the delayers DLY1 through DLY4 in response to the respective first write delay control signals Sa<4:1>.

Delayers DLY1 through DLY3 are configured to delay the input signals by a predetermined delay period, for example, 4 tCK. Delayers DLY1 through DLY3 may comprise a 2-bit counter.

Delayer DLY4 may differ from delayers DLY1 through DLY3 in that it may vary the delay time period. For example, delayer DLY4 may be configured to receive the second write delay control signals INITa<1:0> and is configured to delay the input signal by a predetermined variable delay period, for example, 1 tCK to 4 tCK, in response to the second write delay control signals INITa<1:0>.

The read timing adjustment section 260 is configured to generate a read timing signal RD_CNT by delaying the read command READ by a time period corresponding to the read delay control signal.

The read timing adjustment section 260 includes a switch SW2, a plurality of delayers DLY5 through DLY8, and a plurality of multiplexers MUX5 through MUX8.

The second switch SW2 is configured to input the read command READ to delayer DLY5 in response to the first read delay control signal Sb<0>.

Each of the multiplexers MUX5 through MUX8 is configured to select and output either the read command READ or the output from the respective one of the delayers DLY5 through DLY8 in response to the respective first read delay control signals Sb<4:1>.

Delayers DLY5 through DLY7 are configured to delay the input signals by a predetermined delay period, for example, 4 tCK. Delayers DLY5 through DLY7 may comprise a 2-bit counter.

Delayer DLY8 may differ from delayers DLY5 through DLY7 in that it may vary the delay time period. For example, delayer DLY8 may be configured to receive the second read delay control signals INITb<1:0> and is configured to delay the input signal by a predetermined variable delay period, for example, 1 tCK to 4 tCK, in response to the second read delay control signals INITb<1:0>.

In some exemplary embodiments, the combination section 270 may comprise an OR gate OR1. The combination section 270 is configured to perform an OR operation on the write timing signal WT_CNT and the read timing signal RD_CNT and generate the timing signal R/W_CNT.

An exemplary operation of the timing signal generation unit 200b shown in FIG. 4 will be described below.

For illustration purposes only, it is assumed that the CAS latency information CL<3:0>, the burst length information BL<1:0>, and the CAS write latency information CWL<2:0> are set such that the column address TLA<0> is outputted after 7 tCK from the input of the write command WRITE.

When the write command WRITE is inputted, the first decoder 210 decodes the CAS latency information CL<3:0>, the burst length information BL<1:0>, and the CAS write latency information CWL<2:0>, and generates the first write delay control signals Sa<4:0> and the second write delay control signals INITa<1:0>.

The first write delay control signals Sa<4:0> and the second write delay control signals INITa<1:0> have values that enable the timing adjustment section 250 to delay the write command WRITE by 7 tCK.

The switch SW1 is turned off by the first write delay control signal Sa<0>, and multiplexers MUX1, MUX3 and MUX4 select the outputs of delayers DLY1, DLY3 and DLY4, respectively. Multiplexer MUX2 selects the write command WRITE.

In addition, delayer DLY4 is set to have a delay time period of 3 tCK by the second write delay control signals INITa<1:0>

Delayers DLY1 through DLY3 are set to have a delay period of 4 tCK. Therefore, the write command WRITE is delayed by 7 tCK through delayers DLY3 and DLY4 and outputted as the write timing signal WT_CNT.

When one of the write timing signal WT_CNT and the read timing signal RD_CNT is activated, the combination section 270 outputs the activated signal as the timing signal R/W_CNT. Therefore, in the exemplary operation described above, the write timing signal WT_CNT is outputted as the timing signal R/W_CNT.

As described above, the timing signal generation unit 200a of FIG. 3 is configured such that the single timing adjustment section 240 is commonly used with respect to the write command WRITE and the read command READ. The timing signal generation unit 200b of FIG. 4 is configured such that the separate timing adjustment sections (e.g., the write timing adjustment section 250 and the read timing adjustment section 260) are provided for each of the write command WRITE and the read command READ.

Now, an address output timing control operation according to one exemplary embodiment will be described with reference to FIG. 2.

The storage control signal generation unit 300 activates one of the storage control signals C<0:8> in response to a read or write command READ/WRITE. In this exemplary embodiment, the storage control signal generation unit 300 activates the first storage control signal C<0> in response to the write command WRITE.

The storage/output unit 500 stores the column address TLA<0> in the latch LT1 according to the storage control signal C<0> and the write command WRITE.

In the meantime, the output control signal generation unit 400 activates the first output control signal R<0> among the output control signals R<0:8> in response to the timing signal R/W_CNT.

Thus, the storage/output unit 500 adjusts the column address TLA<0> stored in the latch LT1 based on the output control signal R<0> and outputs it as the tinning-adjusted column address ATCD<0>.

When another write command WRITE or read command READ is inputted, the next storage control signal C<1> is activated. In this manner, signal bits activated among the storage control signals C<0:8> are sequentially shifted according to the write command WRITE or the read command READ sequentially inputted.

The column addresses TLA<0> are sequentially inputted to the storage/output unit 500 in response to continuing read and/or write commands READ/WRITE. The storage/output unit 500 then sequentially stores the column addresses TLA<0> in the plurality of latches LT1 through LT9 according to the storage control signals C<0:8> and the read or write command READ/WRITE.

Likewise, a subsequent timing signal R/W_CNT is generated by another read or write command READ/WRITE. The output control signal R<0> is then shifted according to the subsequent timing signal R/W_CNT, and the output control signal R<1> is activated. In this manner, signal bits activated among the output control signals R<0:8> are sequentially shifted according to the sequentially inputted timing signal R/W_CNT.

Thus, the storage/output unit 500 adjusts the column address TLA<0> stored in the latches LT1 through LT9 based on the output control signals R<0:8> and outputs it as the tinning-adjusted column address ATCD<0>.

The circuit for controlling the address output timing of the semiconductor device, consistent with various exemplary embodiments of the present invention, may immediately generate the information corresponding to the number of clocks necessary for the delay of the column address by decoding the operation specifications related to the read command and the write command, and output the column address at the timing corresponding to the information. Accordingly, the number of flip-flops and latches can be reduced and therefore the circuit area can be reduced.

While certain embodiments have been described above, it will be understood to those skilled in the art that the embodiments described are by way of example only. Accordingly, the address output timing control circuit described herein should not be limited based on the described embodiments. Rather, the address output timing control circuit described herein should only be limited in light of the claims that follow when taken in conjunction with the above description and accompanying drawings.

What is claimed is:

1. An address output timing control circuit of a semiconductor device, comprising:
    a timing signal generation unit configured to decode operation specification information of a semiconductor device and generate a timing signal by delaying a read command or a write command based on a decoding result of the operation specification information;
    a storage control signal generation unit configured to generate a storage control signal in response to the read command or the write command;
    an output control signal generation unit configured to generate an output control signal in response to the timing signal;
    and a storage/output unit configured to store an address in response to the storage control signal and output the stored address as a tinning-adjusted address in response to the output control signal.

2. The circuit according to claim 1, wherein the operation specification information comprises CAS latency information, burst length information, and CAS write latency information.

3. The circuit according to claim 1, wherein the timing signal generation unit comprises:
    a first decoder configured to generate a write delay control signal by decoding the operation specification information related to the write command;
    a second decoder configured to generate a read delay control signal by decoding the operation specification information related to the read command;
    a selection section configured to select the write delay control signal or the read delay control signal in response to the write command or the read command, and output the selected write or read delay control signal as a delay control signal;
    and a timing adjustment section configured to generating the timing signal by delaying the write command or the read command by a time corresponding to the delay control signal.

4. The circuit according to claim 3, wherein the operation specification information related to the write command comprises CAS latency information, burst length information, and CAS write latency information.

5. The circuit according to claim 3, wherein the operation specification information related to the read command comprises CAS latency information and burst length information.

6. The circuit according to claim 3, wherein the timing adjustment section comprises:
    a plurality of delayers;
    and a plurality of multiplexers, each configured to select either one of the read command and the write command or an output from the respective one of the delayers in response to the delay control signal.

7. The circuit according to claim 6, wherein one of the plurality of delayers is configured to vary a delay time period in response to the delay control signal.

8. The circuit according to claim 3, wherein the delay control signal comprises a first delay control signal and a second delay control signal.

9. The circuit according to claim 8, wherein the timing adjustment section comprises:
a plurality of delayers;
and is a plurality of multiplexers, each configured to select either one of the read command and the write command or an output from the respective one of the delayers in response to the first delay control signal,
wherein one of the plurality of delayers is configured to vary a delay time period in response to the second delay control signal.

10. The circuit according to claim 1, wherein the timing signal generation unit comprises:
a first decoder configured to generate a write delay control signal by decoding the operation specification information related to the write command;
a second decoder configured to generate a read delay control signal by decoding the operation specification information related to the read command;
a write timing adjustment section configured to generate a write timing signal by delaying the write command by a first time period corresponding to the write delay control signal;
a read timing adjustment section configured to generate a read timing signal by delaying the read command by a second time period corresponding to the read delay control signal;
and a combination section configured to generate the timing signal by combining the write timing signal and the read timing signal.

11. The circuit according to claim 10, wherein the operation specification information related to the write command comprises CAS latency information, burst length information, and CAS write latency information.

12. The circuit according to claim 10, wherein the operation specification information related to the read command comprises CAS latency information and burst length information.

13. The circuit according to claim 10, wherein the write timing adjustment section comprises:
a plurality of delayers; and a plurality of multiplexers, each configured to select either the write command or an output of the respective one of the delayers in response to the write delay control signal.

14. The circuit according to claim 13, wherein one of the plurality of delayers is configured to vary a delay time period in response to the write delay control signal.

15. The circuit according to claim 10, wherein the read timing adjustment section comprises:
a plurality of delayers; and a plurality of multiplexers, each configured to select either the read command or an output of the respective one of the delayers in response to the read delay control signal.

16. The circuit according to claim 15, wherein one of the plurality of delayers is configured to vary a delay time period in response to the read delay control signal.

* * * * *